(12) United States Patent
Cheng et al.

(10) Patent No.: US 11,327,378 B2
(45) Date of Patent: May 10, 2022

(54) ARRAY SUBSTRATE, DISPLAY PANEL AND DISPLAY DEVICE

(71) Applicant: BOE Technology Group Co., Ltd., Beijing (CN)

(72) Inventors: Hongfei Cheng, Beijing (CN); Pan Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 298 days.

(21) Appl. No.: 16/335,066

(22) PCT Filed: Aug. 21, 2018

(86) PCT No.: PCT/CN2018/101448
§ 371 (c)(1),
(2) Date: Mar. 20, 2019

(87) PCT Pub. No.: WO2019/095764
PCT Pub. Date: May 23, 2019

(65) Prior Publication Data
US 2020/0355970 A1    Nov. 12, 2020

(30) Foreign Application Priority Data

Nov. 17, 2017  (CN) .......................... 201721551996.0

(51) Int. Cl.
*G02F 1/1362*   (2006.01)
*G02F 1/1343*   (2006.01)
*G02F 1/136*    (2006.01)

(52) U.S. Cl.
CPC .. *G02F 1/136286* (2013.01); *G02F 1/134336* (2013.01); *G02F 1/134363* (2013.01);
(Continued)

(58) Field of Classification Search
CPC ................................................ G02F 1/136286
See application file for complete search history.

(56) References Cited

U.S. PATENT DOCUMENTS

2002/0044227 A1*  4/2002  Lee ................... G02F 1/134363
                                                    349/40
2006/0120160 A1   6/2006  Park et al.
(Continued)

FOREIGN PATENT DOCUMENTS

CN         1940682     *   4/2007  ........... G02F 1/1343
CN         1940682 A       4/2007
(Continued)

OTHER PUBLICATIONS

International Search Report and Written Opinion of the International Searching Authority (with English language translation of Written Opinion), International Application No. PCT/CN2018/101448, dated Sep. 30, 2018, 12 pp.
(Continued)

*Primary Examiner* — Sang V Nguyen
(74) *Attorney, Agent, or Firm* — Myers Bigel, P.A.

(57) ABSTRACT

An array substrate includes a base substrate, a plurality of gate lines extending in a row direction on the base substrate, a plurality of data lines extending in a column direction intersecting the row direction on the base substrate, and a plurality of pixel groups in rows and columns, each including two sub-pixels side by side in the row direction. Each of the rows of pixel groups is connected to two respective ones of the gate lines, and the two sub-pixels of each pixel group in the row of pixel groups are respectively connected to different ones of the two respective gate lines. The data lines and the columns of pixel groups are alternately arranged in the row direction, and the two sub-pixels of each of the plurality of pixel groups are connected to a corresponding one of the plurality of data lines directly adjacent to the pixel group.

16 Claims, 8 Drawing Sheets

(52) U.S. Cl.
CPC .... *G02F 1/13606* (2021.01); *G02F 1/134318* (2021.01); *G02F 1/134345* (2021.01); *G02F 1/136295* (2021.01)

(56) References Cited

U.S. PATENT DOCUMENTS

| | | | |
|---|---|---|---|
| 2016/0342044 A1* | 11/2016 | Chang | G02F 1/133512 |
| 2017/0003556 A1* | 1/2017 | Noh | G02F 1/133345 |
| 2017/0192570 A1 | 7/2017 | Choi et al. | |
| 2017/0206857 A1* | 7/2017 | Li | G09G 3/20 |
| 2018/0061291 A1 | 3/2018 | Ren | |
| 2018/0095334 A1* | 4/2018 | Zang | G02F 1/136286 |
| 2018/0107080 A1* | 4/2018 | Chan | G02F 1/1368 |

FOREIGN PATENT DOCUMENTS

| | | | | |
|---|---|---|---|---|
| CN | 202837748 U | | 3/2013 | |
| CN | 105789220 A | | 7/2016 | |
| CN | 105974706 | * | 9/2016 | ........... G02F 1/1362 |
| CN | 105974706 A | | 9/2016 | |
| CN | 207380420 U | | 5/2018 | |
| JP | 60-192920 A | | 10/1985 | |
| KR | 20060023699 A | | 3/2006 | |
| KR | 10-2008-000844 A | | 1/2008 | |

OTHER PUBLICATIONS

"Communication with Supplementary European Search Report", EP Application No. 18865351.3, dated Jul. 12, 2021, 8 pp.

* cited by examiner

ARRAY SUBSTRATE, DISPLAY PANEL AND DISPLAY DEVICE

CROSS-REFERENCE TO RELATED APPLICATIONS

The present application is a 35 U.S.C. 371 national stage application of PCT International Application No. PCT/CN2018/101448, filed on Aug. 21, 2018, which claims the benefit of Chinese Patent Application No. 201721551996.0, filed Nov. 17, 2017, the contents of which are incorporated herein by reference in their entireties.

TECHNICAL FIELD

The present disclosure relates to the field of display technologies, and in particular, to an array substrate, a display panel, and a display device.

BACKGROUND

TFT-LCDs (thin film transistor liquid crystal displays) are increasingly used in high-performance display fields due to their features such as small size, low power consumption, no radiation, and relatively low manufacturing cost.

In the prior art, a display device is generally provided with a plurality of sub-pixels arranged in a matrix, with the sub-pixels located in the same row being connected to the same gate line, and the sub-pixels in the same column being connected to the same data line. The data line is connected to a data driving chip in a non-display area. The number of data driving chips required is determined by the number of the data lines.

SUMMARY

According to an aspect of the present disclosure, an array substrate is provided, comprising: a base substrate; a plurality of gate lines extending in a row direction on the base substrate; a plurality of data lines extending in a column direction intersecting the row direction on the base substrate; and a plurality of pixel groups arranged in rows and columns, each of the plurality of pixel groups comprising two sub-pixels arranged side by side in the row direction. Each of the rows of pixel groups is connected to two respective ones of the gate lines, and the two sub-pixels of each pixel group in the row of pixel groups are respectively connected to different ones of the two respective ones of the gate lines. The data lines and the columns of pixel groups are alternately arranged in the row direction, and the two sub-pixels of each of the plurality of pixel groups are connected to a corresponding one of the plurality of data lines that is directly adjacent to the pixel group.

In some embodiments, each of the rows of pixel groups is between the two respective ones of the gate lines.

In some embodiments, each of the columns of pixel groups is connected to a corresponding one of the plurality of data lines that is directly adjacent to the column of pixel groups.

In some embodiments, every two directly adjacent pixel groups in each of the columns of pixel groups are respectively connected to different ones of two of the plurality of data lines directly adjacent to the column of pixel groups.

In some embodiments, each of the sub-pixels of the plurality of pixel groups comprises a pixel electrode and a thin film transistor connecting the pixel electrode to the corresponding one of the plurality of data lines.

In some embodiments, the thin film transistors of the sub-pixels of each of the columns of pixel group are arranged along a center line between two of the plurality of data lines directly adjacent to the column of pixel groups, and the pixel electrodes of the two sub-pixels of each pixel group in each of the columns of pixel groups are respectively on both sides of the center line.

In some embodiments, the thin film transistor of each of the sub-pixels comprises: a gate electrode connected to a first one of the plurality of gate lines that is connected to the sub-pixel, the gate electrode being arranged in a gate pattern; and a source electrode connected to one of the data lines that is connected to the sub-pixel, the source electrode being arranged in a source pattern comprising a first sub-pattern, extending parallel to the gate lines, in a gap between the first one of the plurality of gate lines and a second one of the plurality of gate lines directly adjacent to the first one of the plurality of gate lines, and a second sub-pattern extending, from an end of the first sub-pattern that is away from the one of the data lines, toward the gate pattern.

In some embodiments, the array substrate further comprises a common electrode and a plurality of common electrode lines extending in the row direction and connected to respective ones of the rows of pixel groups. The common electrode lines are each connected to the common electrode at central positions of corresponding ones of the pixel groups.

In some embodiments, the common electrode has respective openings at positions corresponding to respective ones of the thin film transistors.

In some embodiments, the common electrode has respective openings at positions corresponding to respective ones of intersections of the gate lines and the data lines.

In some embodiments, the common electrode comprises strip sub-electrodes, and wherein the pixel electrode is a planar electrode.

In some embodiments, the common electrode is on a side of the pixel electrode facing away from the base substrate.

In some embodiments, the array substrate further comprises a gate driving circuit connected to the gate lines.

According to another aspect of the present disclosure, a display panel is provided comprising the array substrate as described above.

According to yet another aspect of the present disclosure, a display device is provided comprising the display panel as described above.

These and other aspects of the present disclosure will be apparent from and elucidated with reference to the embodiment(s) described hereinafter.

BRIEF DESCRIPTION OF THE DRAWINGS

Further details, features and advantages of the present disclosure are disclosed in the following description of exemplary embodiments in conjunction with the accompanying drawings in which.

DETAILED DESCRIPTION

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be clearly and completely described below in conjunction with the accompanying drawings.

Figure 1:
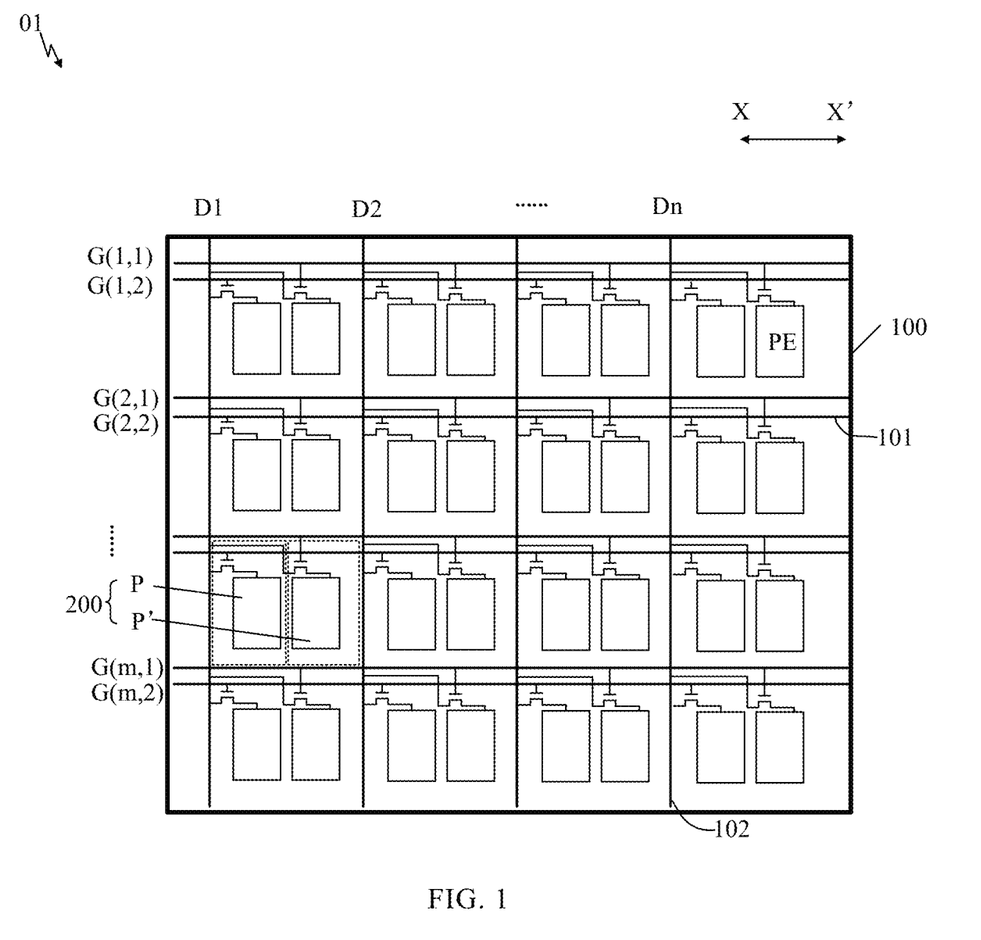
FIG. 1 is a schematic plan view of an array substrate according to an embodiment of the present disclosure.

FIG. 1 is a schematic plan view of an array substrate according to an embodiment of the present disclosure.

As shown in FIG. 1, the array substrate 01 includes a base substrate 100 and a plurality of gate lines 101 and a plurality of data lines 102 on the base substrate 100. The gate lines 101 extend in a row direction X-X', and the data lines 102 extend in a column direction intersecting the row direction X-X'.

The array substrate 01 further includes a plurality of pixel groups 200 arranged in rows and columns. Each of the pixel groups 200 includes two sub-pixels P and P' arranged side by side in the row direction X-X'. In this example, the array substrate 01 includes a plurality of pixel groups 200 arranged in a matrix of m×n, where m and n are positive integers. As such, the array substrate 01 includes sub-pixels arranged in a matrix of m×2n. Each of the sub-pixels includes a pixel electrode PE and a thin film transistor that connects the pixel electrode PE to a corresponding one of the data lines 102.

In the array substrate 01 of FIG. 1, 2 m gate lines are provided. Each row of pixel groups 200 is connected to two respective ones of the 2 m gate lines. More generally, an i-th row of pixel groups 200 is connected to two gate lines G(i,1) and G(i,2), where i=1, 2, . . . , m. For example, the first row of pixel groups 200 is connected to two gate lines G(1,1) and G(1,2), the second row of pixel groups 200 is connected to two gate lines G(2,1) and G(2,2), and the m-th row of pixel groups 200 is connected to two gate lines G(m,1) and G(m,2). The two sub-pixels P and P' of each pixel group 200 in the i-th row of pixel groups are respectively connected to different ones of the corresponding two gate lines. For example, for the pixel group 200 in the first row and the first column, the sub-pixel P is connected to the gate line G(1,2), and the sub-pixel P' is connected to the gate line G(1,1).

In the array substrate 01 of FIG. 1, n data lines D1, D2, . . . , Dn are provided. The data lines D1, D2, . . . Dn and the columns of pixel groups 200 are alternately arranged in the row direction X-X', and the two sub-pixels P and P' of each of the plurality of pixel groups 200 are connected to a corresponding one of the plurality of data lines D1, D2 . . . , Dn that is directly adjacent to that pixel group 200. Specifically, each column of pixel groups 200 is connected to a respective one of the plurality of data lines D1, D2 . . . , Dn that is directly adjacent to that column of pixel groups 200. More specifically, in the example of FIG. 1, the two sub-pixels P and P' of each of the pixel groups 200 are connected to the data line located on the same side (left side in this example) of that pixel group 200.

The array substrate embodiment of FIG. 1 is advantageous in that it reduces the data lines required and thus the data driving chips required. Specifically, only n data lines are required for sub-pixels arranged in a matrix of m×2n. This is half of the data lines of a conventional array substrate in which each column of sub-pixels requires a respective data line. Although the reduction of the data lines is achieved at the expense of the increased gate lines, this is still worthwhile because the number of the data lines in the display device is usually much larger than the number of the gate lines.

Figure 2:
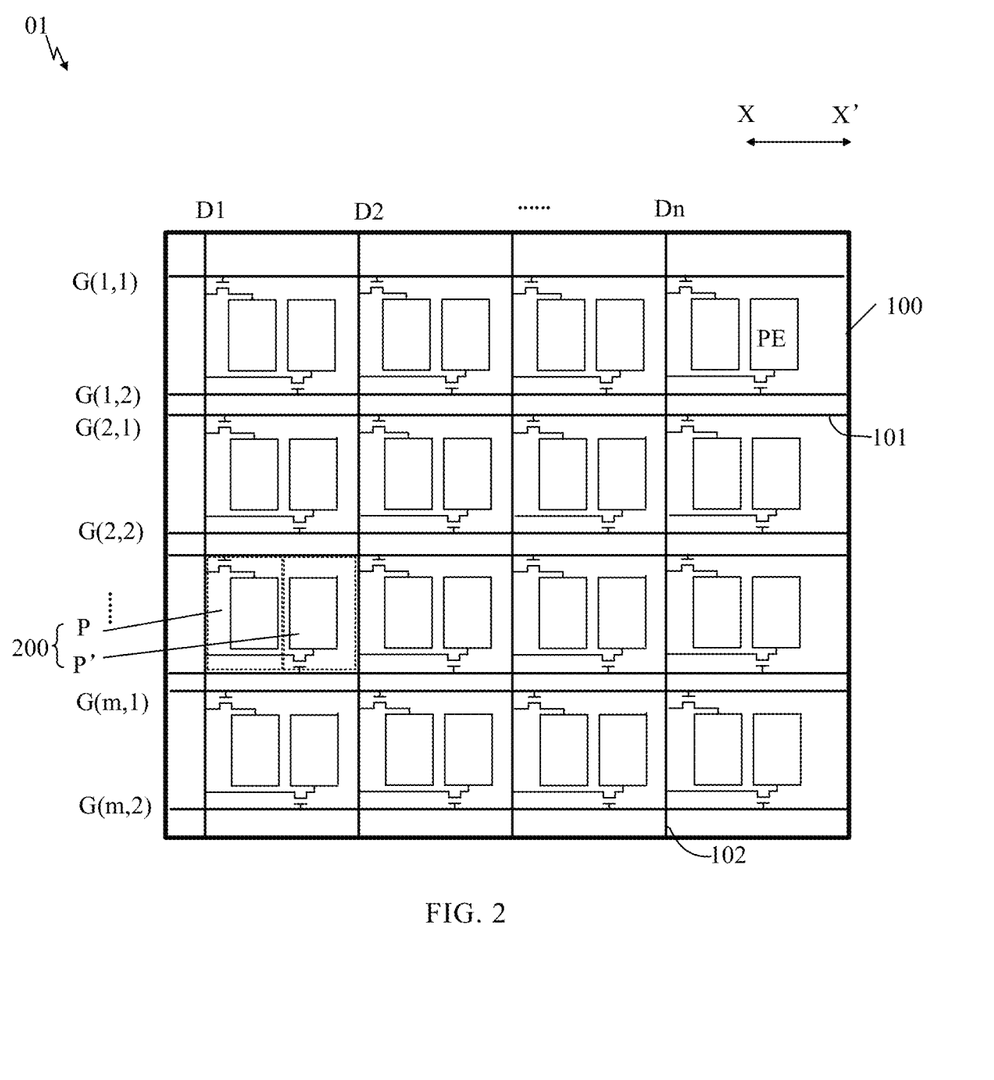
FIG. 2 is a schematic plan view of another array substrate according to an embodiment of the present disclosure.

FIG. 2 is a schematic plan view of another array substrate according to an embodiment of the present disclosure.

Unlike the embodiment of FIG. 1, in the array substrate 01 of FIG. 2, each row of pixel groups 200 is located between respective two gate lines 101 that are connected to that row of pixel groups 200. For example, the first row of pixel groups 200 is located between the gate lines G(1,1) and G(1,2), the second row of pixel groups 200 is located between the gate lines G(2, 1) and G(2, 2), and the m-th row of pixel groups 200 is located between the gate lines G(m,1) and G(m,2).

The arrangement of the gate lines in FIG. 2 provides advantages over the arrangement of the gate lines in FIG. 1. For the arrangement of the gate lines in FIG. 1, since the two gate lines connected to the same row of pixel groups are located on the same side of that row of pixel groups, two patterning processes are required to fabricate these two gate lines respectively in different layers during the fabrication in order to avoid short circuits. Alternatively, if the two gate lines were to be fabricated by a one-time patterning process, it would be necessary to dispose, in a different layer by a separate patterning process, the gates of the thin film transistors connected to one of the two gate lines that is away from that row of pixel groups. This results in a complicated fabrication process and an increase in the thickness of the array substrate. In contrast, in the embodiment of FIG. 2, by arranging each row of pixel groups 200 between the two gate lines 101 connected thereto, the fabrication of the two gate lines and the gates corresponding to these two gate lines can be completed by a one-time patterning process. Therefore, the fabrication process is simplified and the thickness of the array substrate is reduced.

It should be noted that, in the present disclosure, the patterning process may include one or more of the following: photolithography, etching, printing, inkjet, and the like. Photolithography refers to a process including film forming, exposing, developing, etc., which forms a pattern using a photoresist, a mask, an exposure machine, or the like. A corresponding patterning process may be selected according to the specific structure.

Figure 3:
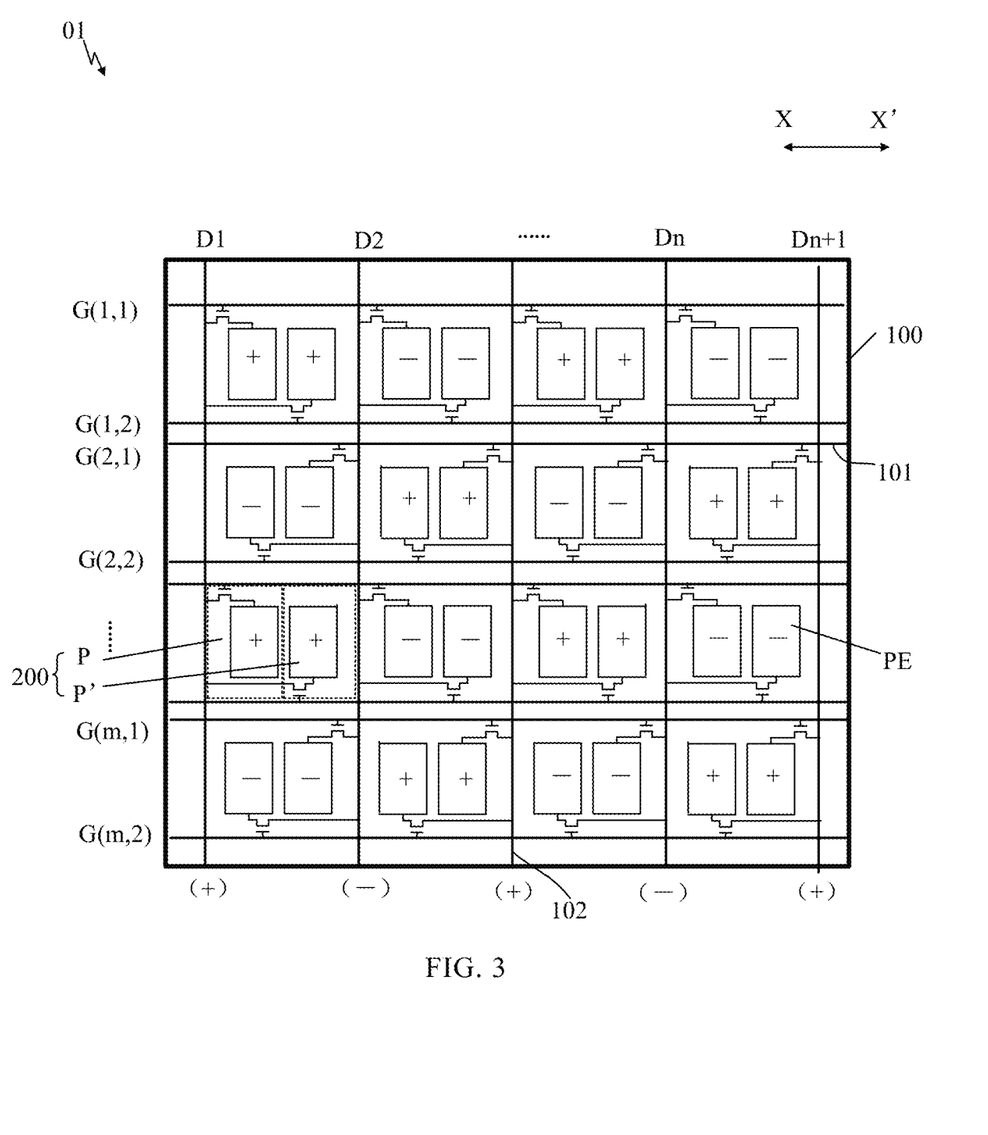
FIG. 3 is a schematic plan view of still another array substrate according to an embodiment of the present disclosure.

FIG. 3 is a schematic plan view of still another array substrate according to an embodiment of the present disclosure.

Unlike the embodiments of FIGS. 1 and 2, n+1 data lines D1, D2, . . . , Dn+1 are provided in the array substrate 01 of FIG. 3. Every two directly adjacent pixel groups in each column of pixel groups 200 are respectively connected to two different ones, of the plurality of data lines D1, D2, . . . , Dn+1, that are directly adjacent to that column of pixel groups 200. For example, the pixel group 200 in the first row and the first column is connected to the data line D1, the pixel group 200 in the second row and the first column is connected to the data line D2, the pixel group 200 in the third row and the first column is connected to the data line D1, and so on.

The embodiment of FIG. 3 provides advantages over the embodiments of FIGS. 1 and 2. For the array substrate shown in FIG. 1 or 2, the polarity of the electrical signal loaded on the data line 102 needs to be reversed 2 m times in a display frame time in the case where the pixel electrodes PE of the sub-pixels are driven in a dot inversion manner. In the case of a display format such as 60 Hz, the polarity of the electrical signal loaded on the data line 102 needs to be inverted at a frequency of 120 m Hz, resulting in a high energy consumption. In contrast, for the array substrate shown in FIG. 3, in the case of the same 60 Hz display format, the polarity of the electrical signal loaded on the data line 102 only needs to be reversed at a frequency of 60 m Hz, thereby greatly reducing the energy consumption.

Figure 4:
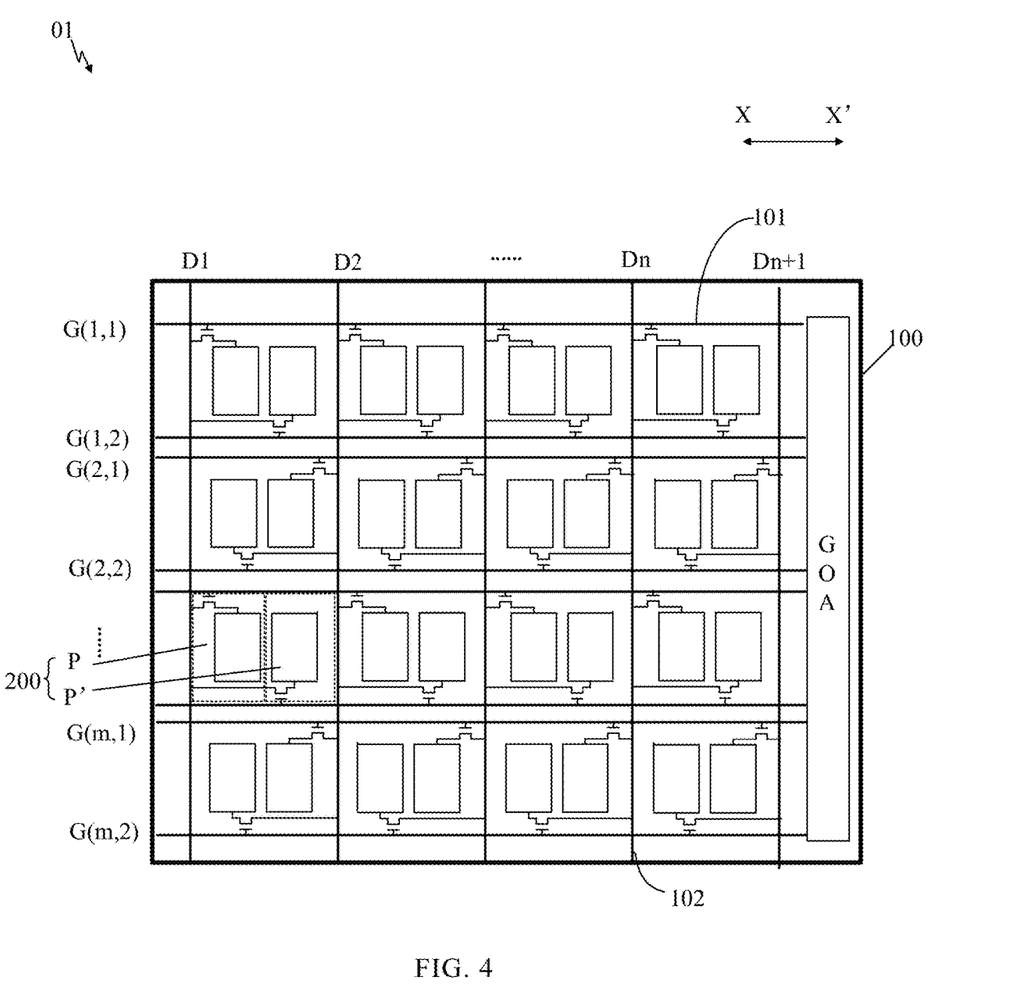
FIG. 4 is a schematic plan view of still another array substrate according to an embodiment of the present disclosure.

FIG. 4 is a schematic plan view of still another array substrate according to an embodiment of the present disclosure.

As shown in FIG. 4, the array substrate 01 further includes a gate driving circuit, more specifically, a gate driver on array (GOA) circuit, that is connected to the gate lines 101. Since the manufacturing cost of the GOA circuit is much lower than that of a discrete gate driving chip, the manufacturing cost can be reduced in spite of a doubled number of gate lines.

In an embodiment, the GOA circuit is disposed in the non-display area of the array substrate 01. The gate lines 101 are connected to the outputs of the GOA circuit. The fabrication of the GOA circuit is completed by a patterning process in the fabrication of the array substrate.

Figure 5:
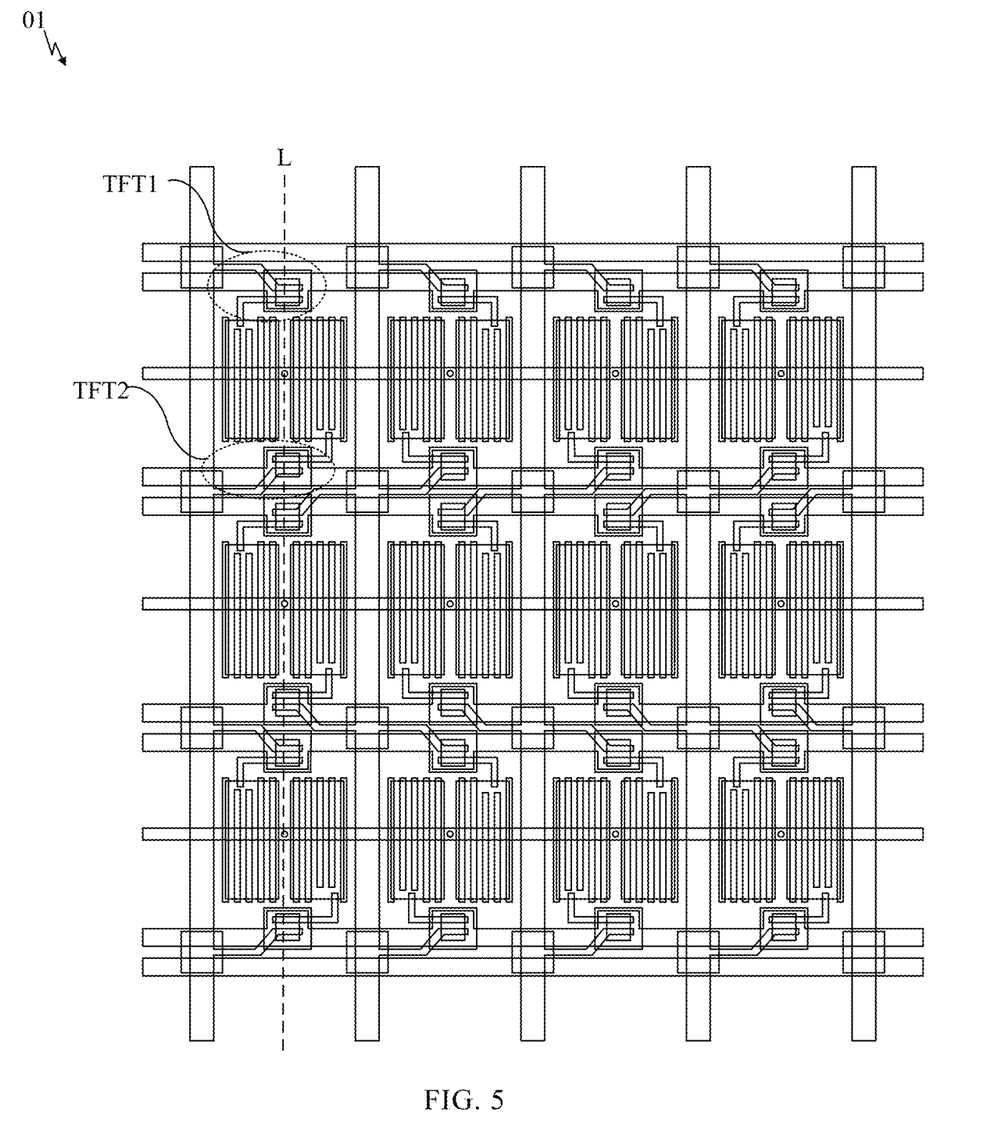
FIG. 5 is a schematic plan view of still another array substrate according to an embodiment of the present disclosure.

FIG. 5 is a schematic plan view of still another array substrate according to an embodiment of the present disclosure.

As shown in FIG. 5, each of the two sub-pixels of each pixel group includes respective thin film transistors TFT1 and TFT2. The thin film transistors TFT1 and TFT2 of the sub-pixels of each column of pixel groups are arranged along a center line L between two of the data lines directly adjacent to that column of pixel groups 200.

The embodiment of FIG. 5 provides advantages over the embodiments of FIGS. 1 to 3. In the embodiments of FIGS. 1 to 3, the two sub-pixels P and P' in the same pixel group 200 are located at different distances from the connected data line 102, resulting in a great difference between the data signal transmission paths to the pixel electrodes PE in these two sub-pixels P and P'. This may lead to uneven brightness of the displayed images. In contrast, the embodiment of FIG. 5 allows for same or similar data signal transmission paths to the two sub-pixels P and P' in the same pixel group 200, thereby improving the uniformity of the displayed images.

Figure 6:
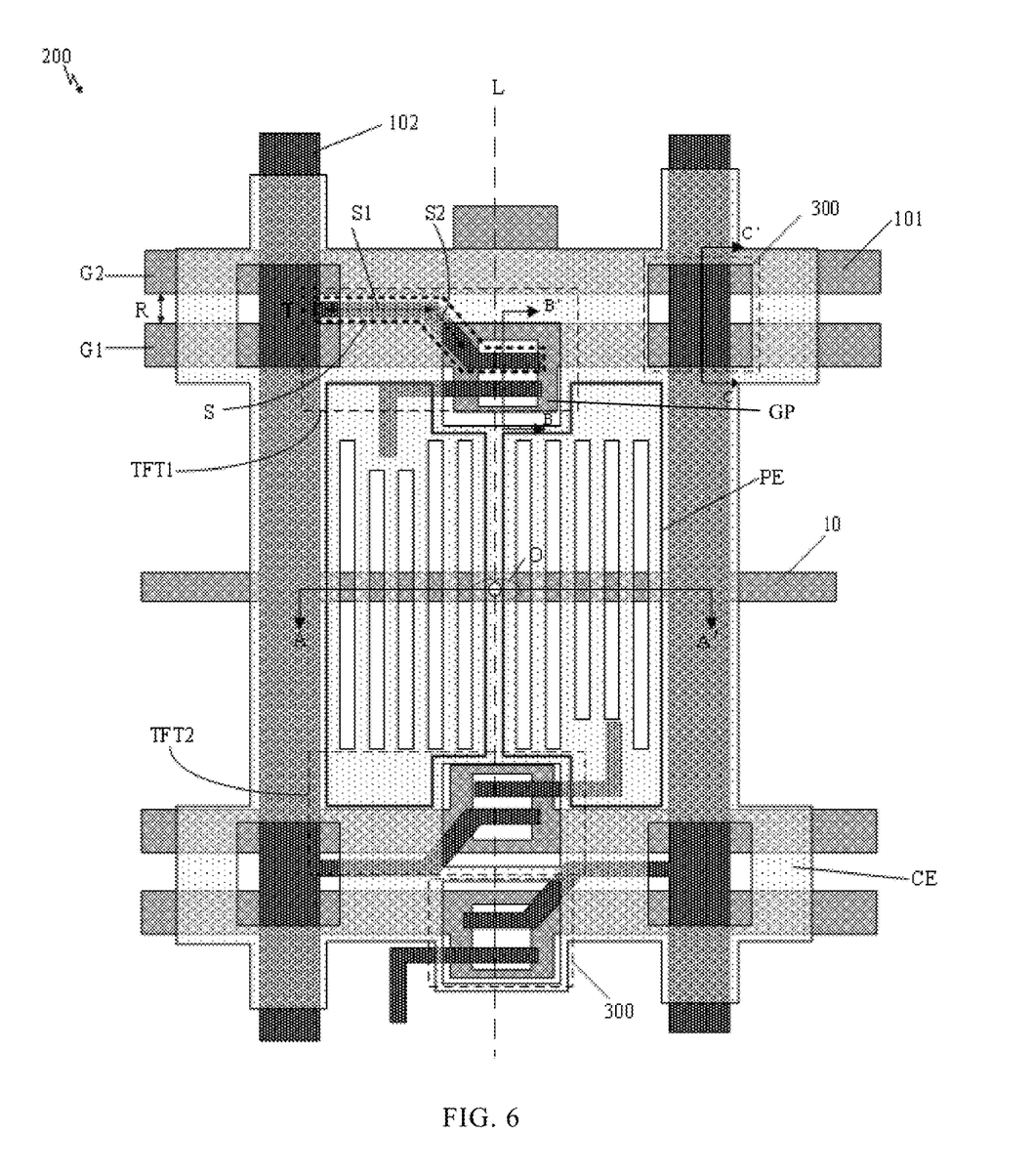
FIG. 6 is an enlarged schematic view of a pixel group in FIG. 5.

FIG. 6 shows an enlarged schematic view of one of the pixel groups 200 in FIG. 5.

As shown in FIG. 6, the two thin film transistors TFT1 and TFT2 of the pixel group 200 are arranged along a center line L. For the purpose of the aperture ratio of the sub-pixels, the two thin film transistors TFT1 and TFT2 are located at inner side of the two gate lines connected to the pixel group 200 and are immediately adjacent to the pixel electrodes PE.

Taking the thin film transistor TFT1 as an example, it includes a gate electrode connected to the first gate line G1 and arranged in a gate pattern GP, and a source electrode connected to the data line 102 and arranged in a source pattern S. The second gate line G2 is directly adjacent to the first gate line G1 with a gap R therebetween. The source pattern S includes a first sub-pattern S1 extending from a connection point T of the source pattern S and the data line 102 toward the center line L in the gap R, and a second sub-pattern S2 extending from an end of the first sub-pattern S1 that is away from the connection point T toward the gate pattern GP of the thin film transistor TFT1. This way, the first sub-pattern S1 does not overlap with the gate lines G1 and G2, lowering the parasitic capacitance between the source pattern S and the gate lines G1 and G2.

In addition, the two pixel electrodes PE in the pixel group 200 are respectively located on both sides of the center line L. This further equalizes the data signal transmission paths to the two sub-pixels P and P', thereby improving the uniformity of the displayed images.

Figure 7:
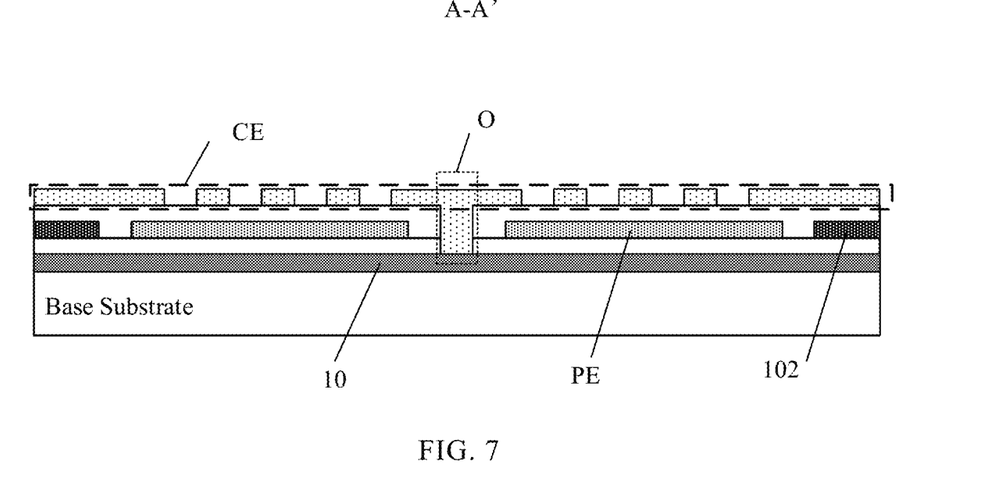
FIG. 7 is a cross-sectional view taken along line A-A' in FIG. 6.

FIG. 7 is a schematic cross-sectional view taken along line A-A' in FIG. 6.

As shown in FIGS. 6 and 7, the array substrate further includes a common electrode CE and a common electrode line 10 connected to the common electrode CE. The common electrode line 10 and the common electrode CE are connected at a central position O of the pixel group 200. This way, the common voltage transferred through the common electrode line 10 can be uniformly applied to the common electrode region corresponding to this pixel group 200, thereby further improving the uniformity of the displayed images.

In an embodiment, the array substrate can be of an advanced-super dimensional switching (ADS) type, an in plane switch (IPS) type, a higher aperture advanced super dimensional switch (HADS), or the like. For an IPS type array substrate, both the pixel electrode and the common electrode are strip electrodes, the strip sub-electrodes of which are spaced apart from each other. For an ADS type array substrate, the pixel electrode is a slit electrode, the common electrode is a planar electrode, and the pixel electrode is located on a side of the common electrode away from the base substrate. For an HADS type array substrate, the common electrode is a slit electrode, the pixel electrode is a planar electrode, and the common electrode is located on a side of the pixel electrode away from the base substrate.

It should be understood that in other embodiments, the common electrode may not be disposed in the array substrate, but is disposed, for example, in a color filter substrate.

Figure 8:
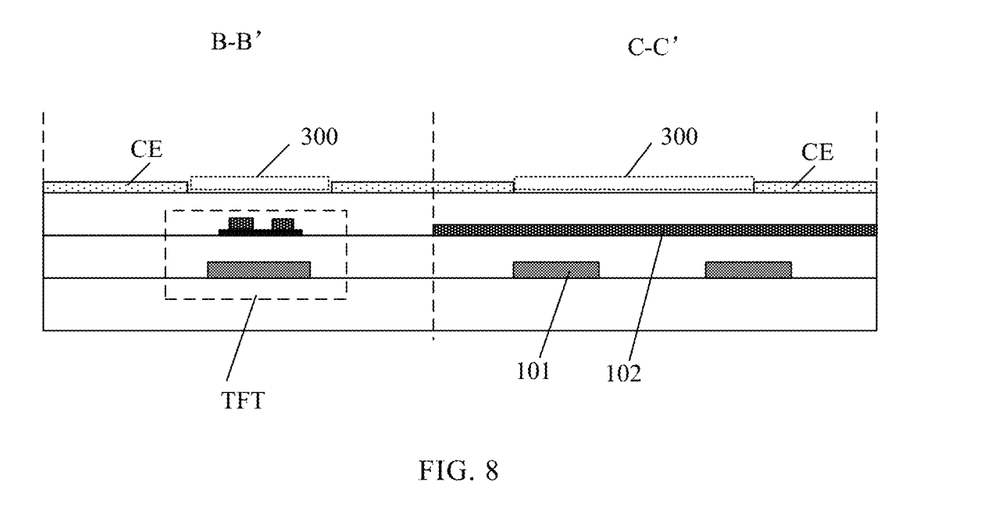
FIG. 8 is a combined illustration of cross-sectional views taken along line B-B' and line C-C' in FIG. 6.

FIG. 8 is a combined illustration of cross-sectional views taken along line B-B' and line C-C' in FIG. 6.

As shown in FIG. 8, the common electrode CE has an opening 300 at a position corresponding to the thin film transistor TFT. The presence of the opening 300 is advantageous in reducing the parasitic capacitance between the common electrode CE and the thin film transistor TFT, thus improving the stability of the performance of the thin film transistor TFT. Alternatively or additionally, as shown in FIG. 8, the common electrode CE has an opening 300 at a position corresponding to an intersection of the gate line 101 and the data line 102, thus reducing the parasitic capacitance between the common electrode CE and the gate line 101/data line 102, and thereby reducing the effect of signals on the gate line and the data line on the common voltage on the common electrode CE.

The opening 300 in FIG. 8 is exemplary and schematic. In some embodiments, the overall area of the common electrode CE corresponding to the thin film transistor TFT is an opening. Alternatively, only a part of the area of the common electrode CE corresponding to the thin film transistor TFT is an opening. In some embodiments, the overall area of the common electrode CE corresponding to the intersection of the gate line 101 and the data line 102 is an opening. Alternatively, only a part of the common electrode CE corresponding to the intersection of the gate line 101 and the data line 102 is an opening.

It should be noted that although the thin film transistor TFT is illustrated as having a bottom gate type in FIG. 8, the present disclosure is not limited thereto. In other embodiments, the thin film transistor TFT may also be of a top gate type. The type of the thin film transistor can be selected as needed.

In addition, the gate lines (including the gate electrodes) and other conductive structures in the same layer as the gate lines may be made of one or more of chromium, tantalum, aluminum, titanium, magnesium, copper, or any alloy thereof. The data lines and other conductive structures in the same layer as the data lines may be made of one or more of chromium, tantalum, aluminum, titanium, magnesium, copper, or any alloys thereof. The pixel electrode, other conductive structures in the same layer as the pixel electrode, the common electrode, and other conductive structures in the same layer as the common electrode may be made of one or more of indium tin oxide (ITO), indium gallium zinc (IGZO), indium zinc oxide (IZO). The gate insulating layer may be made of one or more of silicon nitride, silicon oxide, or silicon oxynitride, and the gate insulating layer may be a single layer structure or a multilayer structure. The passivation layer may be made of one or more of silicon nitride, silicon oxide, or silicon oxynitride, or it may be a resin material. The passivation layer may be a single layer structure or a multilayer structure. The active layer may be made of a polysilicon (a-Si) material. The present disclosure is not limited thereto.

Figure 9:
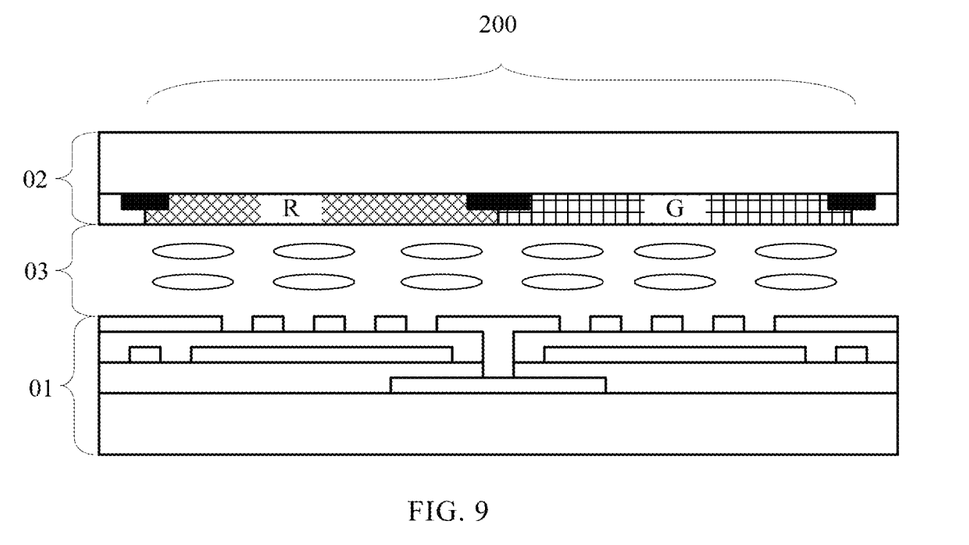
FIG. 9 is a partial cross-sectional view of a display device according to an embodiment of the present disclosure.

FIG. 9 is a partial cross-sectional view of a display device according to an embodiment of the present disclosure. Specifically, FIG. 9 schematically shows a cross-sectional structure of the display device from the perspective of one pixel group 200.

The display device includes the array substrate 01 as described in any of the above embodiments, a counter substrate 02, and a liquid crystal layer 03 between the array substrate 01 and the counter substrate 02.

In the example of FIG. 9, the counter substrate 02 is provided with a color resist pattern of different primary colors (in this case, the counter substrate may also be referred to as a color filter substrate). For example, for the color configuration of three primary colors (RGB), the counter substrate 02 is provided with a red color resist pattern (R) and a green color resist pattern (G) at positions corresponding to the two sub-pixels in the pixel group 200, respectively. It should be understood that although not shown, the color resist patterns may be sequentially arranged in the order of red, green, and blue in the row direction. A black matrix is also provided to the counter substrate 02 at regions between adjacent sub-pixels and at a non-display area surrounding a display region comprised of all the sub-pixels. In order not to obscure the subject matter of the present disclosure, a detailed description of the counter substrate 02 is omitted herein.

Figure 10:
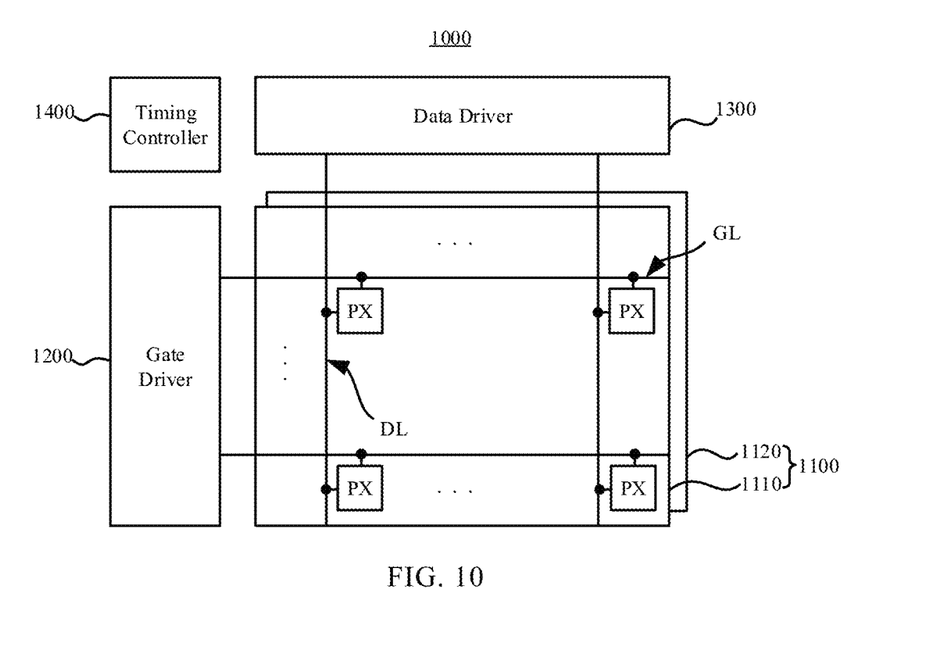
FIG. 10 is a schematic block diagram of a display device according to an embodiment of the present disclosure.

FIG. 10 is a block diagram showing a display device 1000 according to an embodiment of the present disclosure.

Referring to FIG. 10, the display device 1000 includes a display panel 1100 for displaying images, a gate driver 1200 for outputting gate scan signals to the display panel 1100, a data driver 1300 for outputting data voltages to the display panel 1100, and a timing controller 1400 for controlling the gate driver 1200 and the data driver 1300.

The display panel 1100 includes an array substrate 1110 and a counter substrate 1120 opposite to the array substrate 1110. In the case of a liquid crystal display device, the display panel 110 further includes a liquid crystal layer (not shown) sandwiched between the array substrate 1110 and the counter substrate 1120, and the counter substrate 1120 may be a color filter substrate. In the case of an organic light emitting diode display device, the counter substrate 1120 may be a cover plate. The array substrate 1110 includes a plurality of pixel regions PX arranged in an array. The pixel regions PX are located at respective ones of intersections of the plurality of gate lines GL and the plurality of data lines DL. Each of the pixel regions includes a pixel including a thin film transistor (not shown) and other associated components. The array substrate 1110 can take the form of any of the array substrates described above with respect to FIGS. 1-9.

The gate driver 1200 is electrically connected to first ends of the gate lines GL, thereby sequentially applying gate scan signals to the gate lines GL. In some exemplary embodiments, the gate driver 1200 may be directly mounted (e.g., integrated) in the array substrate 1110. Alternatively, the gate driver 1200 may be connected to the display panel 1100 through a Tape Carrier Package (TCP).

The data driver 1300 is electrically connected to first ends of the data lines DL to output data voltages to the data lines DL. In some embodiments, the data driver 1300 may include a plurality of data driving chips that operate in parallel.

The timing controller 1400 controls the operation of each of the gate driver 1200 and the data driver 1300. Specifically, the timing controller 1400 outputs data control signals and image data to control the driving operation of the data driver 1300, and outputs gate control signals to control the driving operation of the gate driver 1200. The data control signals and the image data are applied to the data driver 1300. The gate control signals are applied to the gate driver 1200.

In embodiments, the display device 1000 may be any product or component having a display function such as a liquid crystal panel, an electronic paper, an OLED panel, a mobile phone, a tablet computer, a television, a monitor, a notebook computer, a digital photo frame, a navigator, and the like.

The foregoing is only specific embodiments of the present disclosure, and the scope of the present disclosure is not limited thereto. Various variations or substitutions to the disclosed embodiments can be made by a person skilled in the art without departing from the scope of the disclosure. Therefore, the scope of the disclosure should be defined by the appended claims.

What is claimed is:

1. An array substrate, comprising:
a base substrate;
a plurality of gate lines extending in a row direction on the base substrate;
a plurality of data lines extending in a column direction intersecting the row direction on the base substrate; and
a plurality of pixel groups arranged in rows and columns, each of the plurality of pixel groups comprising two sub-pixels arranged side by side in the row direction,
wherein each of the rows of pixel groups is connected to two respective ones of the gate lines, and the two sub-pixels of each pixel group in the row of pixel groups are respectively connected to different ones of the two respective ones of the gate lines,
wherein the data lines and the columns of pixel groups are alternately arranged in the row direction, the two sub-pixels of each pixel group are connected to the data line on a same side of the pixel group,
wherein each of the sub-pixels of the plurality of pixel groups comprises a thin film transistor, and each thin film transistor comprises a gate electrode connected to a first one of the plurality of gate lines that is connected to the sub-pixel, the gate electrode being arranged in a gate pattern; and
wherein the array substrate further comprises a common electrode, the common electrode has respective first openings at positions corresponding to respective ones of intersections of the gate lines and the data lines, and orthographic projections of the first openings on the base substrate do not overlap with orthographic projections of the gate electrodes on the base substrate.

2. The array substrate of claim 1, wherein each of the rows of pixel groups is between the two respective ones of the gate lines.

3. The array substrate of claim 2, wherein each of the sub-pixels of the plurality of pixel groups comprises a pixel electrode, and the thin film transistor connects the pixel electrode to the corresponding one of the plurality of data lines.

4. The array substrate of claim 3,
wherein the respective thin film transistor of each of the sub-pixels of each of the columns of pixel groups are arranged along a center line between two of the plurality of data lines directly adjacent to the column of pixel groups, and
wherein the pixel electrodes of the two sub-pixels of each pixel group in each of the columns of pixel groups are respectively on both sides of the center line.

5. The array substrate of claim 4, wherein the thin film transistor of each of the sub-pixels comprises:
a source electrode connected to one of the data lines that is connected to the sub-pixel,
wherein the source electrode is arranged in a source pattern comprising a first sub-pattern, extending parallel to the gate lines, in a gap between the first one of the plurality of gate lines and a second one of the plurality of gate lines directly adjacent to the first one of the plurality of gate lines, and
wherein a second sub-pattern extends from an end of the first sub-pattern that is away from the one of the data lines, toward the gate pattern.

6. The array substrate of claim 4, further comprising:
a plurality of common electrode lines extending in the row direction and connected to respective ones of the rows of pixel groups,
wherein the common electrode lines are each connected to the common electrode at central positions of corresponding ones of the pixel groups.

7. The array substrate of claim 6, wherein the common electrode has respective second openings at positions corresponding to respective ones of the thin film transistors.

8. The array substrate of claim 6,
wherein the common electrode comprises strip sub-electrodes, and
wherein the pixel electrode comprises a planar electrode.

9. The array substrate of claim 8, wherein the common electrode is on a side of the pixel electrode facing away from the base substrate.

10. The array substrate of claim 1, further comprising:
a gate driving circuit connected to the gate lines.

11. A display panel comprising an array substrate, the array substrate comprising:
a base substrate;
a plurality of gate lines extending in a row direction on the base substrate;
a plurality of data lines extending in a column direction intersecting the row direction on the base substrate; and
a plurality of pixel groups arranged in rows and columns, each of the plurality of pixel groups comprising two sub-pixels arranged side by side in the row direction,
wherein each of the rows of pixel groups is connected to two respective ones of the gate lines, and the two sub-pixels of each pixel group in the row of pixel groups are respectively connected to different ones of the two respective ones of the gate lines,
wherein the data lines and the columns of pixel groups are alternately arranged in the row direction,
wherein the two sub-pixels of each pixel group are connected to the data line on a same side of the pixel group,
wherein each of the sub-pixels of the plurality of pixel groups comprises a thin film transistor, and each thin film transistor comprises a gate electrode connected to a first one of the plurality of gate lines that is connected to the sub-pixel, the gate electrode being arranged in a gate pattern; and
wherein the array substrate further comprises a common electrode, the common electrode has respective first openings at positions corresponding to respective ones of intersections of the gate lines and the data lines, and orthographic projections of the first openings on the base substrate do not overlap with orthographic projections of the gate electrodes on the base substrate.

12. A method of manufacturing an array substrate, wherein the array substrate comprises a plurality of gate lines, a plurality of data lines intersecting the plurality of gate lines, a plurality of pixel groups defined by the plurality of gate lines and the plurality of data lines, and a common electrode, two sub-pixels of each pixel group are connected to the data line on a same side of the pixel group, wherein each of the plurality of pixel groups comprises two sub-pixels comprising respective thin-film transistors having respective gate electrodes that are connected to two corresponding ones of the plurality of gate lines, the common electrode has respective first openings at positions corresponding to respective ones of intersections of the gate lines and the data lines, and orthographic projections of the first openings on the array substrate do not overlap with orthographic projections of the gate electrodes on the array substrate, the method comprising:
manufacturing, by a one-time patterning process, the two corresponding ones of the plurality of gate lines and the gate electrodes that are connected to the two corresponding ones of the plurality of gate lines.

13. The array substrate of claim 1, wherein each of the columns of pixel groups is connected to a corresponding one of the plurality of data lines that is directly adjacent to the column of pixel groups.

14. The array substrate of claim 1, wherein every two directly adjacent pixel groups in each of the columns of pixel groups are respectively connected to different ones of two of the plurality of data lines directly adjacent to the column of pixel groups.

15. The array substrate of claim 2, wherein each of the columns of pixel groups is connected to a corresponding one of the plurality of data lines that is directly adjacent to the column of pixel groups.

16. The array substrate of claim 2, wherein every two directly adjacent pixel groups in each of the columns of pixel groups are respectively connected to different ones of two of the plurality of data lines directly adjacent to the columns of pixel groups.

* * * * *